United States Patent [19]

Gervay et al.

[11] 4,278,752

[45] Jul. 14, 1981

[54] FLAME RETARDANT RADIATION SENSITIVE ELEMENT

[75] Inventors: Joseph E. Gervay, Red Bank; Yvan P. Pilette, Lawrenceville, both of N.J.

[73] Assignee: E. I. Du Pont de Nemours and Company, Wilmington, Del.

[21] Appl. No.: 121,438

[22] Filed: Feb. 14, 1980

Related U.S. Application Data

[63] Continuation-in-part of Ser. No. 940,170, Sep. 7, 1978, abandoned, which is a continuation-in-part of Ser. No. 780,907, Mar. 24, 1977, abandoned, which is a continuation-in-part of Ser. No. 735,979, Oct. 27, 1976, abandoned.

[51] Int. Cl.$^3$ ............................................. G03C 1/68
[52] U.S. Cl. ................................. 430/281; 430/271; 430/273; 430/288; 430/905; 204/159.17; 204/159.2
[58] Field of Search ............... 430/281, 373, 315, 288, 430/905, 273, 271; 204/159.17, 159.2

[56] References Cited

U.S. PATENT DOCUMENTS 4,058,443  11/1977  Murata et al. .................. 204/159.17

FOREIGN PATENT DOCUMENTS 49-107048  10/1974  Japan .
1042520  9/1966  United Kingdom .
1312492  4/1973  United Kingdom .

*Primary Examiner*—Jack P. Brammer

[57] ABSTRACT

A radiation sensitive element comprising a support bearing a layer of photopolymerizable composition which comprises (1) at least one addition polymerizable ethylenically unsaturated compound, (2) an initiator activatable in the ultraviolet to visible region of the spectrum, and (3) at least 20% by weight of a polymeric binder containing at least 5% by weight of acrylonitrile, the composition having present at least 5% by weight halogen based on the total weight of composition covalently bonded to an aromatic moiety of at least one of said components of the composition and/or a conjugated vinyl component. The elements withstand soldering and are flame retardant and are useful as solder masks.

15 Claims, No Drawings

FLAME RETARDANT RADIATION SENSITIVE ELEMENT

This is a continuation-in-part of Application Ser. No. 940,170, filed Sept. 7, 1978, now abandoned which is a continuation-in-part of Application Ser. No. 780,907, filed Mar. 24, 1977, now abandoned, which, in turn is a continuation-in-part of Application Ser. No. 735,979, filed Oct. 27, 1976, now abandoned.

BACKGROUND OF THE INVENTION

This invention relates to photopolymerizable elements which are flame retardant, solder resistant and are useful as solder mask.

DESCRIPTION OF THE PRIOR ART

Radiation sensitive elements, i.e., dry layers of radiation sensitive compositions on a film support, are well known as being useful as photoresists for preparing printed circuits. The elements are also useful for other purposes. One important use is as dry, film solder masks wherein the radiation sensitive elements are applied to portions of a printed circuit board surface to confine molten solder heated to a temperature of at least 230° C. to pad areas on the board and to prevent bridging between conductors during tinning operations and during soldering of components. A solder mask also functions to prevent or minimize corrosion of the bare copper conductors and as a dielectric to insulate certain components from adjacent circuitry. Since a solder mask remains on the finished circuit board, i.e., the solder mask is a permanent coating for the printing circuit, it usually is transparent to allow for ease of circuit inspection.

Known radiation sensitive compositions have many uses, one important use being for solder masks. When used for this purpose, however, certain precautions must be followed. A major problem with the solder mask compositions is that they support combustion. Therefore extreme care must be followed when the solder mask compositions are exposed to elevated temperatures, e.g., during soldering. Because of the combustibility problems associated with solder mask compositions, dependent on their use, e.g., process and surface to which such compositions are applied, the government has set combustibility standards.

Useful solder mask compositions which are photopolymerizable can be prepared from at least one ethylenically unsaturated monomer, a polymeric compound and a photoinitiator or photoinitiator system. These compositions do not, however, meet the established combustibility standards. Several procedures are known to make such photopolymerizable compositions flame retardant. One procedure is to add commercially available flame retarding materials, e.g., $Sb_2O_3$, to the solder mask compositions. While achieving a high level of flame retardance, it was found that some of the properties of the compositions became inferior. It was therefore found desirable to either reduce substantially the amount of $Sb_2O_3$ present or to eliminate $Sb_2O_3$ entirely. The problem has arisen of how to make the solder mask composition withstand soldering and be flame retardant while retaining the properties necessary for the composition to function as a resist to solder and permanent coating, e.g., properties of adhesion, flexibility, solvent, heat, and moisture resistance, and be a dielectric as well.

In Sony KK Japanese Application No. 17193 filed Feb. 12, 1973 (Publication 49-107048/1974) photopolymerizable flame retardant resin compositions are described which are particularly suitable as surface coatings for printed circuit boards. The flame retardant compositions contain a halogenated bisphenol epoxy acrylic resin which ethylenic unsaturated-modified terminals, a polymer with ethylenically unsaturated-modified terminals, a viscosity modifier and a photoinitiator. The flame retardant compositions in the form of a printing ink are applied by means of silk screen printing. Screen printing poses several problems. The curable ink must flow; yet if too much flow occurs, there is "shadowing", or flow, of the ink into holes and into areas intended to be open. Misregistration can also result in a conductor adjacent to a pad being left open with subsequent bridging of solder in the tinning operation or in soldering components.

U.S. Pat. No. 4,058,443 discloses a photopolymerizable composition for peel-apart (dry) development for use as an etching resist, comprising a chlorinated polyolefin, an addition-polymerizable monomer, and photopolymerization initiator and a second polymer material having a molecular weight above 10,000 for the purpose of increasing the mechanical strength of the resist. No hint of use as a solder mask or in solvent development is given on how to make a photopolymerizable composition suitable as a solder mask.

It is therefore desirable to avoid the above problems by using solder mask compositions as dry film. The dry films have further advantages over the silk screen technique, for example, the reduced time and ease of preparation of the masked circuit boards.

SUMMARY OF THE INVENTION

The present invention solves the problem by providing a radiation-sensitive solder mask element having a support bearing a layer of photopolymerizable composition useful as a permanent coating for a printed circuit, which comprises (a) at least one addition polymerizable ethylenically unsaturated compound having a boiling point above 100° C. at normal pressure, (b) an organic free radical-generating addition polymerization initiator activatable by actinic radiation in the ultraviolet-to-visible region of the spectrum and (c) at least 20% by weight of a macromolecular organic polymeric binder, based on the total weight of the composition, the improvement for the purpose of rendering the composition flame retardant and resistant to molten solder without blistering or degradation of the photopolymerizable layer upon polymerization which comprises (1) utilizing as the binder component a macromolecular organic polymer containing at least 5% by weight acrylonitrile monomeric units and
(2) incorporating by covalent bonding to at least one component (a), (b) and (c) of the photopolymerizable composition at least 5% by weight of halogen based on the total weight of the composition, with the proviso that the covalent halogen bond is to an aromatic moiety or a conjugated vinyl component.

DETAILED DESCRIPTION OF THE INVENTION

The photopolymerizable compositions as described above are limited only in that the components must be compatible with one another, and they must be capable of being formed into dry layers. A preferred photopolymerizable composition comprises: (a) up to four ethylenically unsaturated compounds, preferably two or three, 20 to 65% by weight; (b) up to three macromoecular organic polymeric binders, preferably two, 20 to 35% by weight, at least one binder containing at least 5% by weight acrylonitrile; and (c) an organic, free-radical generating addition polymerization initiator or initiator system activatable by actinic radiation in the ultraviolet to visible region of the spectrum, 0.4 to 10.0% by weight, the composition containing at least 5% by weight halogen, e.g., bromine, chlorine, covalently bonded to an aromatic moiety or a conjugated vinyl component. All the weight percentages are based on the total weight of the composition. Covalent bonding is required so that the layer can withstand soldering without blistering or degradation as occurs when the halogen is not covalently bonded to one of the aforesaid components. Effective components are those wherein the halogen is covalently bonded to an aromatic moiety of at least one of the ethylenically unsaturated compound (a), polymeric binder (b) and initiator (c), or to at least one conjugated vinyl component, e.g., in either monomeric form or as a polymer such as 2-chlorobutadiene-1,3. Effective compounds are therefore aryl halides and conjugated vinyl halides. Compounds such as vinylidene chloride copolymers, e.g., vinylidene chloride/acrylonitrile copolymers, do not fall within the scope of this invention because they are saturated compounds which lose hydrogen chloride upon heating. The presence of such compounds in the solder mask results in blistering or degradation of the solder mask.

The halogen can be present in the composition covalently bonded to one, two or three of the components described above or any combination thereof, many of which are illustrated in the examples. In a particularly preferred composition, 10 to 50% by weight of the ethylenically unsaturated compounds are halogenated. At the lower level of halogen present in the composition up to 10% by weight of $Sb_2O_3$ can be present to further increase flame retardance. Above the 10% by weight amount the desirable properties of the photopolymerizable element, e.g., adhesion, surface smoothness, etc., begin to degrade. As the amount of halogen in the composition increases the quantity of $Sb_2O_3$ can be reduced or eliminated entirely.

The preferred radiation sensitive element comprises a photopolymerizable layer with a thickness of about 0.0003 inch (0.0008 cm) to about 0.01 inch (0.025 cm) having adhered thereto with low to moderate adherence a thin, flexible polymeric film support which transmits radiation actinic to the photopolymerizable layer. The other side of the photopolymerizable layer may have adhered thereto a protective cover sheet with less adherence to the layer than adherence between the support and the layer.

A suitable strippable film support which preferably has a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch (~0.0006 cm) to 0.008 inch (~0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film having a thickness of about 0.001 inch (~0.0025 cm).

A suitable removable, protective, cover sheet may be chosen from the same group of high polymer films described above and may have the same wide range of thicknesses. A cover sheet of 0.001 inch (~0.0025 cm) thick polyethylene is especially suitable. Supports and cover sheets as described above provide good protection to the photopolymerizable layer.

The flexible, photopolymerizable layer is prepared from monomeric components, polymeric binder components, photopolymerization initiators and other additives set forth below. It is understood that at least the minimum amount of halogen must be present and the binder must contain at least 5% by weight acrylonitrile to provide flexibility to the layer even after photoexposure and exposure to molten solder. A desirable range of acrylonitrile is 5 to 15%.

Suitable monomers having a boiling point greater than 100° C. at normal pressure which can be used as the sole monomer or in combination with others include the following: tribromophenoxy ethyl methacrylate, 1,5-pentanediol diacrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, 2,2-di(p-hydroxyphenyl)-propane diacrylate, pentaerythritol tetraacrylate, 2,2-di(p-hydroxyphenyl)propane dimethacrylate, triethylene glycol diacrylate, polyoxyethyl-2,2-di(p-hydroxyphenyl)propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro bisphenol-A, di(2-methacryloxyethyl)ether of tetrachloro bisphenol-A, di-(3-methacryloxy-2-hydroxypropyl)ether of tetrabromo bisphenol-A, di-(2-methacryloxyethyl)ether of tetrabromo bisphenol-A, di-(3-methacryloxy-2-hydroxypropyl)ether of 1,4-butanediol, di-(3-methacryloxy-2-hydroxypropyl)ether of diphenolic acid, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerytritol tetramethacrylate, trimethylol propane trimethacrylate, 1,5-pentanediol dimethacrylate, diallyl fumarate, 1,4-benzenediol dimethacrylate, 1,4-diisopropenyl benzene, and 1,3,5-triisopropenyl benzene.

Also useful in the photopolymerizable layer is at least one of the following ethylenically unsaturated compounds having a molecular weight of at least 300. Preferred monomers of this type are: an alkylene or a polyalkylene glycol diacrylate prepared from an alkylene glycol of 2 to 15 carbons or a polyalkylene ether glycol of 1 to 10 ether linkages, and those discosed in U.S. Pat. No. 2,927,022, e.g., those having a plurality of addition polymerizable ethylenic linkages particularly when present as terminal linkages and especially those wherein at least one and preferably most of such linkages are conjugated with a double bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures.

Suitable binders which can be used as the sole binder or in combination with others include the following with the proviso that the binder provides at least 5% by weight of acrylonitrile based on the total weight of the composition: Polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers, polystyrene polymers and copolymers, e.g., with maleic anhydride and esters; saturated and unsaturated polyurethanes; synthetic rubbers, e.g., butadiene/acrylonitrile, acrylonitrile/butadiene/styrene and/or bromostyrene, methyl methacrylate/acrylonitrile/butadiene/styrene copolymers, 2-chlorobutadiene/1,3-polymers, and styrene/butadiene/styrene, styrene/isoprene/styrene block copolymers; polybromostyrene; polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula HO(CH$_2$)$_n$OH, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetete succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehyde.

Preferred free-radical generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methyl-anthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenylimidazolyl dimers, e.g., 2-o-chlorophenyl-4,5-diphenylimidazolyl dimer, with hydrogen donors, and mixtures thereof as described in U.S. Pat. Nos. 3,427,161; 3,479,185 and 3,549,367, can be used as initiators.

Other useful additives include thermal inhibitors, colorants, plasticizers, fillers, etc. Some of the ingredients can act in a dual role. For example, in the monomer binder systems the ethylenically unsaturated photopolymerizable compound can also act as a plasticizer for the thermoplastic binder.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitroso dimers, e.g., 1,4,4-trimethyl-2,3-diazobicyclo[3.2.2]-non-ene-2,3-dioxide, nitrobenzene and dinitrobenzene, p-toluquinone and chloranil.

Various dyes and pigments may be added to increase the visibility of the solder-resist image. Any colorant used, however, should preferably be transparent to the actinic radiation used.

The radiation-sensitive photopolymerizable elements are especially useful as solder masks. They are particularly advantageous because they possess resistance to molten solder and flame retardance without the sacrifice of other properties, e.g., flexibility after exposure, adhesion, photospeed, electrical insulation, and moisture, heat, and solvent resistance needed for resist and solder mask functionality as a solder resist and permanent coating for printed circuits. Utilizing the preferred elements it is possible to receive a favorable flammability rating, e.g., UL 94, with a printed circuit board of 0.030 inch (0.76 cm) and in some instances a circuit board as thin as 0.020 inch (0.51 mm).

EXAMPLES OF THE INVENTION

The following examples, wherein the weights are in percent unless otherwise indicated, illustrate the invention.

In the examples the coating solutions were prepared by thoroughly mixing the indicated ingredients. After mixing, each solution was coated on a 0.001 inch (0.0025 cm) thick polyethylene terephthalate film so that the dried coating solution was 0.004 inch (0.01 cm) thick. After solvent evaporation, the films were cut in ½ inch by 5 inch (1.27×12.7 cm) strips and were laminated at a temperature of 90° C. to both sides of a 1/32 inch (0.79 mm) thick Westinghouse epoxy glass laminate. The films were then exposed for two minutes to a 1000-watt mercury vapor arc (Colight "DMVL"). The exposed samples were then tested for flammability using Underwriters' Laboratory's subject 94 Test (UL 94) and/or the Oxygen Index Method (ASTM D2863-70). The results of the flammability tests are indicated after the examples set forth below.

EXAMPLE 1

| Components | Solution (g) |
| --- | --- |
| Trimethylolpropane triacrylate | 25.0 |
| Di-(3-acryloxy-2-hydroxypropyl) ether of tetrabromo bisphenol-A | 40.0 |
| Benzophenone | 6.0 |

-continued

| Components | Solution (g) |
| --- | --- |
| Michler's ketone | 0.5 |
| Methyl methacrylate (95)/ethyl methacrylate (5) copolymer | 10.0 |
| Methyl methacrylate (46)/acrylonitrile (9)/butadiene (14)/styrene (31) resin | 33.0 |
| Methylene chloride to make | 150 |

The solution contained 13.32% by weight bromine. Utilizing the UL 94 test, five test strips prepared from the solution were tested and had an average combustion within 1.4 seconds after each of the first and second ignitions.

EXAMPLE 2

| Components | Solution 1 (g) | Solution 2 (g) |
| --- | --- | --- |
| Polyoxyethylated tri-methylolpropane triacrylate | 23.0 | 25.0 |
| Di-(3-methacryloxy-2-ethyl) ether of tetrabromo bisphenol-A | 33.0 | 22.0 |
| Benzophenone | 5.0 | 6.0 |
| Michler's ketone | 0.5 | 0.5 |
| Methyl methacrylate/acrylo-nitrile/butadiene/styrene resin as in Ex. 1 | 29.2 | 30.0 |
| Methyl methacrylate (95)/ ethyl methacrylate(5) copolymer | 9.0 | 10.0 |
| Antimony oxide | — | 6.0 |
| Methylene chloride to make | 275 | 275 |

Solution 1 contained 14.19% by weight bromine; Solution 2 contained 9.46% by weight bromine. Utilizing the UL 94 test five test test strips prepared from each of the solutions were tested. Solution 1 had an average combustion within 1.8 seconds after each of the first and second ignitions. Solution 2 had an average combustion within 0.9 seconds. The maximum combustion time for all strips was within 10 seconds.

EXAMPLE 3

| Components | Solutions (g) | | | | | |
| --- | --- | --- | --- | --- | --- | --- |
| | 1 | 2 | 3 | 4 | 5 | 6 |
| Pentaerythritol triacrylate | 41.5 | 30.0 | 18.5 | 7.0 | 24.0 | 30.0 |
| Di-(3-acryloxy-2-ethyl) ether of tetrabromo bisphenol-A | — | 11.5 | 23.0 | 34.5 | 11.5 | 11.5 |
| Michler's ketone | 0.4 | 0.4 | 0.4 | 0.4 | 0.4 | 0.4 |
| Benzophenone | 5.3 | 5.3 | 5.3 | 5.3 | 5.3 | — |
| Chlorobenzophenone | — | — | — | — | — | 5.3 |
| Methyl methacrylate acrylonitrile/butadiene/ styrene resin as in Ex. 1 | 42.5 | 42.5 | 42.5 | 42.5 | 42.5 | 42.5 |
| Methyl methacrylate (95)/ ethyl methacrylate (5) copolymer | 10.0 | 10.0 | 10.0 | 10.0 | 10.0 | 10.0 |
| Antimony oxide | — | — | — | — | 6.0 | — |
| Monastral ® green (pigment) | 0.3 | 0.3 | 0.3 | 0.3 | 0.3 | 0.3 |
| Methylene chloride | 150 | 150 | 150 | 150 | 150 | 150 |

Sample 1 is a control. Each solution was tested by the Oxygen Index Method and the halogen content and the oxygen index numbers are set forth in the following table:

| | Solutions | | | | | |
| --- | --- | --- | --- | --- | --- | --- |
| | 1 | 2 | 3 | 4 | 5 | 6 |
| % Halogen by weight based on the total compositions | — | 5.0 | 10.0 | 15.0 | 5.0 | 5.0 |
| Oxygen Index No. | 18.1 | 19.2 | 20.1 | 20.7 | 21.1 | 19.2 |

An epoxy-fiberglass circuit board having a plurality of raised copper circuit lines was laminated at 85° C. with a photopolymerizable element prepared from solution above. The photopolymerizable composition was substantially free of components which would volatilize in the polymerized layer at temperatures reached in molten metal application. The laminated board was cooled to room temperature, the supported side of the photopolymerizable element was exposed to ultraviolet radiation in an image pattern through the support, and the support was removed. Alternatively, the support could be removed prior to exposure. The unexposed areas were then removed by washing them with 1,1,1-trichloroethane solvent which removed only the unexposed, unpolymerized areas and not the exposed, polymerized areas. Electrical components can then be added to the board with their wire leads bent over the appropriate circuit lines in the areas from which the areas of unexposed photopolymer had been removed.

The side of the circuit board having the circuit lines was then coated with flux and wave soldered at 3.5 feet (1.07 m) per minute with a commercial wave soldering machine with a preheat station at ~18.9° C. to 143° C. The solder was a eutectic mixture of 63% tin and 37% lead. The solder pot also contained about 1-5% oil at 232°-260° C. After application of the solder, the board was cooled and cleaned in 1,1,1-trichloroethane solvent. Excellent flame retardant solder masks were achieved except for control Sample 1.

EXAMPLE 4

| Components | Solution (g) |
| --- | --- |
| Pentaerythritol triacrylate | 22.4 |
| Di-(3-acryloxy-2-hydroxy-propyl)ether of bisphenol-A | 9.4 |
| Tribromophenoxy ethyl methacrylate | 21.1 |
| Benzophenone | 5.3 |
| Michler's ketone | 0.4 |
| Antimony oxide | 6.7 |
| Methyl methacrylate/acrylo-nitrile/butadiene/styrene copolymer as in Ex. 1 | 29.6 |
| Methyl methacrylate 95/ethyl methacrylate (5) copolymer | 2.24 |
| Polymethyl methacrylate | 2.24 |
| Monastral ® green (pigment) | 0.3 |
| Methylene chloride to make | 275 |

The solution contained 13.0% by wt. of halogen. Utilizing the UL 94 test, the average combustion time for five test strips from the coating was within five seconds after each of the first and second ignitions. The maximum combustion time for all strips was within ten seconds.

EXAMPLE 5

| Components | Solution (g) |
| --- | --- |
| Pentaerythritol triacrylate | 31.0 |
| Polychloroprene | 44.6 |

-continued

| Components | Solution (g) |
|---|---|
| Di-(3-acryloxy-2-hydroxypropyl)ether of bisphenol-A | 10.0 |
| 2-o-chlorophenyl-4,5-diphenylimidazolyl dimer | 4.0 |
| 2-mercaptobenzothiazole | 1.5 |
| Methyl methacrylate/acrylonitrile/ butadiene/styrene copolymer as in Ex. 1 | 3.6 |
| Phosgard ® C-22-R, organophosphorus compound | 5.0 |
| Monastral ® green (pigment) | 0.3 |
| Methylene chloride to make | 500 |

*Phosgard ® C-22-R is an organophosphorus compound of the formula

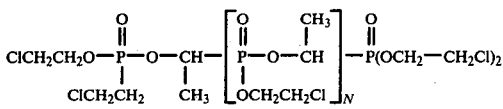

having a specific gravity at 25°/25° C. of 1.425–1.445, viscosity, centipoise at 99° C. of 55 to 85 with percentages of chlorine and phosphorus being 27% and 15%, respectively.

The solution contained 16.9% by weight chlorine. Utilizing the UL 94 test, the average combustion time for five test strips from the coating was within five seconds after each of the first and second ignitions. Utilizing the Oxygen Index Test the oxygen index no. was determined as 23.3.

EXAMPLE 6

| Components | Solutions (g) 1 | 2 |
|---|---|---|
| Polychloroprene (2-chlorobutadiene-1,3) | 44.6 | 44.6 |
| Pentaerythritol triacrylate | 26.0 | 26.0 |
| Di-(3-acryloxy-2-ethyl) ether of tetrabromo bisphenol-A | 7.0 | — |
| Di-(3-acryloxy-2-hydroxypropyl) ether of bisphenol-A | 10.0 | 17.0 |
| 2-o-chlorophenyl-4,5-diphenylimidazolyl dimer | 4.0 | 4.0 |
| 2-mercaptobenzooxazole | 1.0 | 1.0 |
| 2-mercaptobenzothiazole | 0.5 | 0.5 |
| Methyl methacrylate/acrylonitrile butadiene/styrene resin as in Ex. 1 | 3.5 | 3.5 |
| Monastral ® green (pigment) | 0.3 | 0.3 |
| Antimony oxide (Sb₂O₃) | 3.5 | 3.5 |
| Methylene chloride to make | 500 | 500 |

Solution 1 contained 20.0% halogen and solution 2 contained 17.0% halogen. Utilizing the UL 94 test, the average combustion time for five test strips prepared from solutions 1 and 2 was within five seconds after each of the first and second ignitions. The maximum combustion time for all strips was within ten seconds. The films were tested as solder masks as described in Example 3 with excellent results being achieved.

EXAMPLE 7

Two coating solutions were prepared by thoroughly mixing the following ingredients:

| Components | Solutions (g) 1 | 2* |
|---|---|---|
| Pentaerythritol triacrylate | 22.0 | 25.0 |
| Di-(3-acryloxy-2-hydroxypropyl) ether of bisphenol-A | 22.0 | 25.0 |
| Michler's ketone | 0.4 | 0.4 |
| Benzophenone | 5.3 | 5.3 |
| Polybromostyrene | 40.0 | — |
| Methyl methacrylate/acrylonitrile butadiene/styrene resin as in Ex. 1 | 10.0 | 33.0 |

| Components | Solutions (g) 1 | 2* |
|---|---|---|
| Methyl methacrylate (95)/ethyl methacrylate (5) copolymer | — | 10.2 |
| Monastral ® green pigment | 0.3 | 0.3 |
| Methylene chloride to make | 250 | 250 |

*Solution 2 is a control; dry coating is not flame retardant.

After mixing each solution was coated on a 0.001 inch (0.0025 cm) thick polyethylene terephthalate film so that the dried coating solution was 0.004 inch (0.01 cm) thick. After solvent evaporation, the films were laminated at 85° C. to an epoxy-fiberglass circuit board having a plurality of raised copper circuit lines. The laminated board was cooled to room temperature, the supported side of the photopolymer film was exposed to ultraviolet radiation in an image pattern through the support, and the support removed. The unexposed areas were then removed by washing them with 1,1,1-trichloroethane solvent which removed only the unexposed unpolymerized areas and not the exposed polymerized areas. The side of the circuit boards having the circuit lines was then coated with flux and dipped for ten seconds in a solder bath at a temperature of 300° C. The solder was a eutectic mixture of 40% lead and 60% tin. Both samples demonstrated excellent stability. The dry coating of solution 1 is flame retardant.

EXAMPLE 8

Three coating solutions were prepared by thoroughly mixing the following ingredients (weight in grams):

| Components | Sample 1 Solution | Control 2 Solution | Control 3 Solution |
|---|---|---|---|
| Polyoxyethylated trimethylolpropane triacrylate | 25.0 | 25.0 | 25.0 |
| Di-(3-methacryloxy-2-ethyl)ether of tetrabromo bisphenol-A | 15.0 | — | 15.0 |
| Bis acryloxy ethyl tetrabromo bisphenol-A | 10.0 | — | 10.0 |
| Tetrabromo bisphenol-A | — | 25.0 | — |
| Benzopheneone | 5.3 | 5.3 | 5.3 |
| Michler's ketone | 0.4 | 0.4 | 0.4 |
| Methyl methacrylate (46)/acrylonitrile (9)/ butadiene (14)/styrene (31) resin | 30.0 | 30.0 | 6.0 |
| Methyl methacrylate (95)/ethyl methacrylate (5) copolymer | 8.0 | 8.0 | 8.0 |
| Methyl methacrylate resin | — | — | 24.0 |
| Monastral ® green pigment | 0.3 | 0.3 | 0.3 |
| Antimony oxide | 6.0 | 6.0 | 6.0 |
| Methylene chloride to make | 218 | 218 | 218 |

The solutions were each coated at room temperature on a 0.001 inch (0.0025 cm) thick polyethylene terephthalate film so that the dried coating solutions were 0.004 inch (0.01 cm) thick. Epoxy-fiberglass circuit boards having a plurality of raised copper circuit lines were laminated at 85° C. with the photopolymerizable elements prepared from the solutions described above. Sample 1 photopolymerizable solution was substantially free of components which would volatilize in the polymerized layer at temperatures reached in the molten metal application. The supported sides of the photopolymerizable elements were exposed to UV radiation through an image pattern, and the supports were removed. The unexposed areas were then removed by washing with 1,1,1-trichloroethane solvent which removed only the unexposed, unpolymerized areas, and not the exposed, polymerized areas. The side of the circuit boards having the circuit lines was then coated with a flux, and wave soldered at 3.5 feet (107 cm) per minute with a commercial wave soldering machine with a preheat station at ~18.9° C. to 143° C. The solder was a eutectic mixture of 63% tin and 37% lead. The solder pot also contained about 1–5% oil at 232°–260° C. After application of the solder the boards were cooled and cleaned in 1,1,1-trichloroethane solvent.

Sample 1 gave an excellent solder mask; Control 2 gave a solder mask with blisters; and Control 3, which contained only 0.54% acrylonitrile in the binder, (based on the weight of the composition) gave a solder mask that was brittle.

Sample 1 and Control 3, wherein the photosensitive layer contained 25% by weight covalently bonded halogen based on the total weight of composition provided excellent properties against the elevated temperatures reached during soldering, Example 3, however, is brittle (scratch line at bottom became chipped) due to the absence of at least 5% by weight of acrylonitrile in the binder. Control 2, wherein the photosensitive layer contains halogen but none of the halogen is covalently bonded to one of the components of the composition, is not effective as a solder mask as shown by the blisters throughout the printed circuit. The scratch line at the bottom of Sample 1 and Control 2 are not chipped illustrating that the photosensitive layers which contain at least 5% acrylonitrile in the binder are not brittle.

We claim:

1. In a solvent-developable radiation-sensitive solder mask element having a support bearing a layer of photopolymerizable composition useful as a permanent coating for a printed circuit, which comprises (a) at least one addition polymerizable ethylenically unsaturated compound having a boiling point above 100° C. at normal pressure, (b) an organic free radical-generating addition polymerization initiator activatable by actinic radiation in the ultraviolet-to-visible region of the spectrum and (c) at least 20% by weight of a macromolecular organic polymeric binder, based on the total weight of the composition, the improvement for the purpose of rendering the composition flame retardant and resistant to molten solder without blistering or degradiation of the photopolymerizable layer upon polymerization which comprises (1) utilizing as the binder component a macromolecular organic polymer containing at least 5% by weight acrylonitrile monomeric units and (2) incorporating halogen by covalent bonding to at least component (a) of the photopolymerizable composition, the weight percent of covalently bonded halogen based on the total weight of the composition being at least 5 weight percent, with the proviso that the covalent halogen bond is to an aromatic moiety or a conjugated vinyl component.

2. An element according to claim 1 wherein any of said unsaturated compound (a) is at least a difunctional compound.

3. An element according to claim 1 wherein the halogen is covalently bonded solely to said unsaturated compound (a).

4. The element according to claim 3 wherein said halogen is covalently bonded to an aromatic moiety of said unsaturated compound (a).

5. An element according to claim 3 wherein the halogenated unsaturated compound is present together with at least one other unsaturated compound.

6. An element according to claim 1 wherein a portion of said halogen is covalently bonded to an aromatic moiety of said initiator.

7. An element according to claim 1 wherein said polymeric binder compound is nonhalogenated.

8. An element according to claim 1 wherein at least one ethylenically unsaturated compound is nonhalogenated.

9. An element according to claim 1 wherein said photopolymerizable composition comprises 20 to 65% by weight of up to four ethylenically unsaturated compounds;

20 to 35% by weight of up to three macromolecular organic polymeric binders; and 0.4 to 10.0% by weight of an organic, free-radical generating addition polymerization initiator, all weight percentages being based on the total weight of composition.

10. An element according to claim 9 wherein 10 to 50% by weight of the ethylenically unsaturated compounds are halogenated compounds.

11. An element according to claims 5, 7 or 9 wherein the composition contains up to 10% by weight of $Sb_2O_3$.

12. An element according to claim 1 wherein a strippable cover sheet is present on said photopolymerizable layer.

13. An element according to claim 1 wherein at least one of said halogenated unsaturated compounds (a) is a di(acryloxy)ether of tetrachloro or tetrabromo bisphenol-A.

14. An element according to claim 1 wherein a binder present is polybromostyrene.

15. An element according to claim 1 wherein at least one of said covalently bonded halogen compounds is a 2-chlorobutadiene-1,3-polymer.

* * * * *